United States Patent

Zee

(10) Patent No.: US 6,681,200 B2
(45) Date of Patent: Jan. 20, 2004

(54) METHOD FOR MEASURING SYSTEM CLOCK SIGNAL FREQUENCY VARIATIONS IN DIGITAL PROCESSING SYSTEMS

(75) Inventor: Oscar Zee, Kista (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 317 days.

(21) Appl. No.: 09/795,231

(22) Filed: Feb. 26, 2001

(65) Prior Publication Data

US 2002/0165679 A1 Nov. 7, 2002

(51) Int. Cl.[7] .............................................. H04B 15/00
(52) U.S. Cl. ........................... 702/190; 707/3; 703/303
(58) Field of Search ............................. 702/75, 78, 79, 702/106, 124, 126, 190, 197, FOR 103, FOR 104, FOR 107, FOR 134; 707/3–8; 708/303; 370/229, 230.1, 231; 348/607

(56) References Cited

U.S. PATENT DOCUMENTS

| | | | |
|---|---|---|---|
| 5,319,583 A | * | 6/1994 | Wildes ........................ 708/303 |
| 5,490,094 A | * | 2/1996 | Heimburger et al. ........ 348/607 |
| 5,978,795 A | * | 11/1999 | Poutanen et al. .............. 707/3 |
| 6,023,453 A | * | 2/2000 | Ruutu et al. ................. 370/229 |
| 6,359,658 B1 | * | 3/2002 | He et al. ..................... 348/607 |
| 6,490,556 B1 | * | 12/2002 | Graumann et al. .......... 704/233 |

OTHER PUBLICATIONS

Bentley, J.: *Thanks, Heaps*; Communications of the ACM; Mar. 1, 1985; vol. 28, No. 3; pp. 245–250.
Standard Search Report RS 106562 US; Date: Sept. 21, 2001.

* cited by examiner

*Primary Examiner*—Marc S. Hoff
*Assistant Examiner*—Mohamed Charioui (57) ABSTRACT

A method for measuring system clock signal frequency variations is disclosed, whereby the number of search operations can be limited to $\log_2 n$, where n is the number of elements (signal values) within the sliding window used. A binary tree is used to sort the minimum value. A condition imposed for the binary tree is that the signal values for both the children elements are greater than or equal to the signal value for the parent element. As such, each element of the binary tree contains a signal value and a flag that indicates which of the two children elements contains the smallest signal value. The element at the root of the tree contains the smallest signal value for the entire tree. Whenever a new signal value for an element is retrieved, the new signal value replaces the oldest signal value in the elements involved. The element containing the oldest signal value can be located anywhere in the tree.

10 Claims, 9 Drawing Sheets

METHOD FOR MEASURING SYSTEM CLOCK SIGNAL FREQUENCY VARIATIONS IN DIGITAL PROCESSING SYSTEMS

BACKGROUND OF THE INVENTION

1. Technical Field of the Invention

The present invention relates in general to the digital processing field and, in particular, to a method for measuring system clock signal frequency variations in digital processing systems.

2. Description of Related Art

A typical method used to assess the quality of a system clock in a digital processing system is to continuously monitor the frequency of the system clock signal over a pertinent period of time. Specifically, the basic approach followed with this method is to continuously measure variations in the clock signal frequency (i.e., frequency wander or drift). Essentially, the less the clock signal frequency wanders or drifts during the measurement period, the higher the clock signal quality.

U.S. Pat. No. 5,319,583 discloses one or more methods for measuring system clock signal quality which are currently being used. A sliding window minimum or maximum filter with a window length, n, is used to convert a series of input data values into a series of output data values. Each output value is the minimum (or maximum) of the current input value and the n−1 preceding input values. As such, this method is used to measure the minimum (or maximum) clock signal frequencies.

A digital data signal buffer is used, which is large enough to store the resulting "n" minimum (or maximum) measured signal values within the length (time interval, T) of the sliding window. The filter produces, for each input signal, an output signal which is the minimum or maximum of all the values within the buffer up to the most recent input signal value. The buffer is updated each signal measurement period, (T/n), such that each time a new signal measurement value is stored in the buffer, the oldest value is deleted. Consequently, it becomes necessary to perform a search to re-compute the output signal. As such, every time a new signal is stored in the buffer, the output signal has to be re-computed. Consequently, the buffer update time can become quite excessive. Therefore, it is desirable to minimize the update time.

According to U.S. Pat. No. 5,319,583, the solution disclosed has an average (buffer) update or search time which is independent from both the length of the buffer used to store the incoming signal values and the resolution of the stored data. However, for the worst case scenario using such a solution, the number of elements that can be searched is n/3, where n is the number of elements within the sliding window. In other words, the size of the sliding window determines the computation (and output signal re-computation) time, and for the worst case scenario, this value (n/3) can be quite large. Notwithstanding the solutions disclosed in U.S. Pat. No. 5,319,583, the basic problem that still needs to be resolved is to determine just how to improve clock signal frequency measurement performance by reducing the search or computation time and the number of operations required to perform the clock signal frequency minimum (or maximum) measurements in real-time. Nevertheless, as described in detail below, the present invention successfully resolves the above-described problems and other related problems.

SUMMARY OF THE INVENTION

In accordance with a preferred embodiment of the present invention, a method for measuring system clock signal frequency variations is provided, whereby the number of search operations can be limited to $\log_2 n$, where n is the number of elements (containing signal values) within the sliding window used. For this embodiment, a binary search tree is used to sort the minimum value. A condition imposed for the binary tree is that the signal values contained in both the children elements are greater than or equal to the signal value contained in the parent element. As such, each element of the binary tree contains a signal value, and a flag indicating which of the two children elements contains the smallest signal value. The element at the root of the tree contains the smallest signal value for the entire tree. Whenever a new signal value for an element is retrieved, the new signal value replaces the oldest signal value in the tree. The element containing the oldest signal value can be located anywhere in the tree.

An important technical advantage of the present invention is that a method is provided for minimizing the number of operations required to compute a minimum value for a sliding window minimum filter even if the sliding window contains a relatively large number of elements.

Another important technical advantage of the present invention is that a method is provided for minimizing the response time for a sliding window minimum filter.

Still another important technical advantage of the present invention is that a method is provided for improving the performance of a sliding window minimum filter.

Yet another important technical advantage of the present invention is that a method is provided for improving the performance of system clock signal frequency measurements.

BRIEF DESCRIPTION OF THE DRAWINGS

A more complete understanding of the method and apparatus of the present invention may be had by reference to the following detailed description when taken in conjunction with the accompanying drawings wherein.

DETAILED DESCRIPTION OF THE DRAWINGS

The preferred embodiment of the present invention and its advantages are best understood by referring to FIGS. 1A–6 of the drawings, like numerals being used for like and corresponding parts of the various drawings.

Essentially, in accordance with a preferred embodiment of the present invention, a method for measuring system clock signal frequency variations is provided, whereby the number of search operations can be limited to $^2\log n$, where n is the number of elements (containing signal values) within the sliding window used. For this embodiment, a binary tree is used to search for and sort the minimum value. A condition imposed for the binary tree is that the signal values for both the children elements are greater than or equal to the signal value for the parent element. As such, each element of the binary tree contains a signal value, and a flag indicating which of the two children elements contains the smallest signal value. The element at the root of the tree contains the smallest signal value in the entire tree. Whenever a new signal value for an element is retrieved, the new signal value replaces the oldest signal value in the elements involved. The element containing the oldest signal value can be located anywhere in the tree.

Specifically, in accordance with the preferred embodiment of the present invention, FIGS. 1A–1I are related diagrams of binary search trees that can be used to implement the present invention. For this exemplary embodiment, it can be assumed that a binary search tree is a tree in which each node (parent) or element has at least a left and right child. The node or element at the top of the tree is the root. As illustrated by FIGS. 1A–1I, for this embodiment, a binary tree is used to sort (from the root downward) the minimum values derived from system clock signal frequency measurements.

Figure 1A:
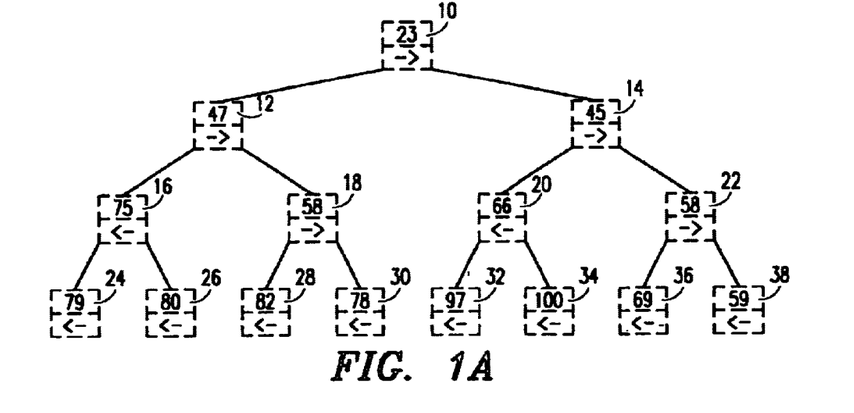
FIGS. 1A–1I are related diagrams of a binary search tree that can be used to implement a preferred embodiment of the present invention.
Figure 1B:
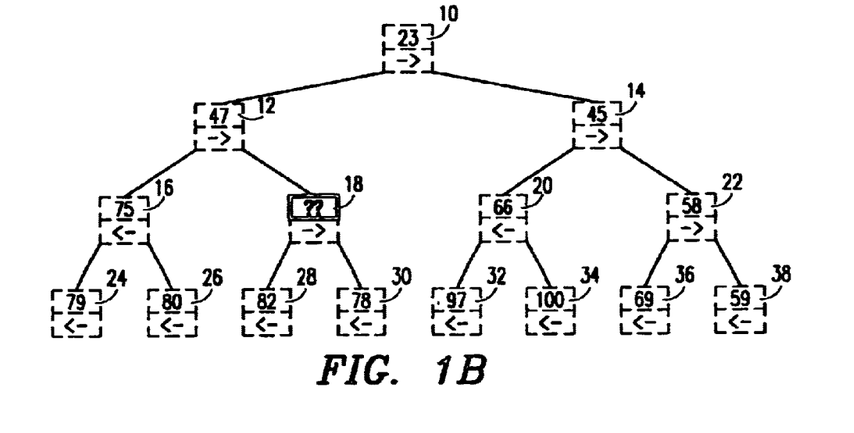

Referring to FIG. 1A, as implemented by a method of the present invention (e.g., see FIG. 2 below), the root 10 of the tree contains the lowest frequency measurement value. The children (e.g., 12, 14) contain frequency measurement values which are greater than or equal to the value contained in the parent node (e.g., node 10). A flag (indicated by an arrow) associated with each child indicates which child (grandchild or great-grandchild) of a pair contains the smallest value.

Figure 1C:
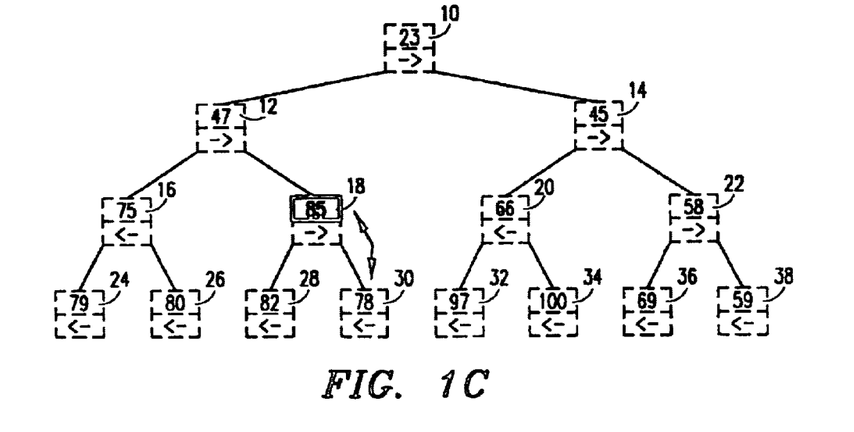
Figure 1D:
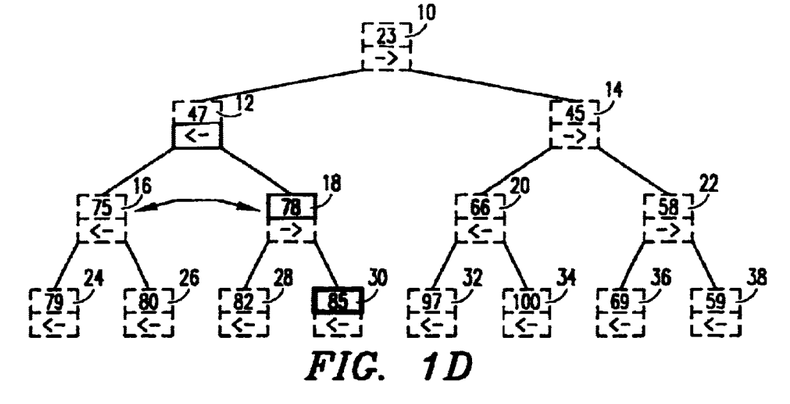
Figure 1E:
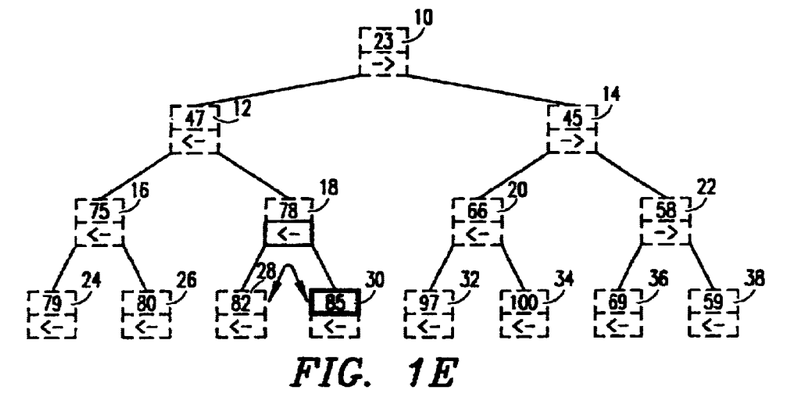
Figure 1F:
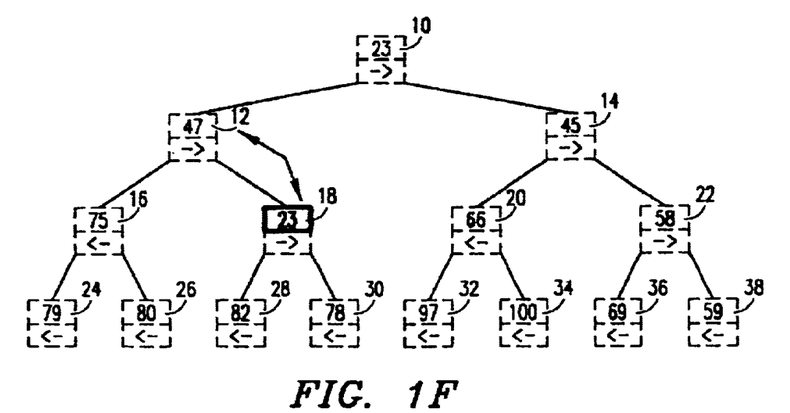
Figure 1G:
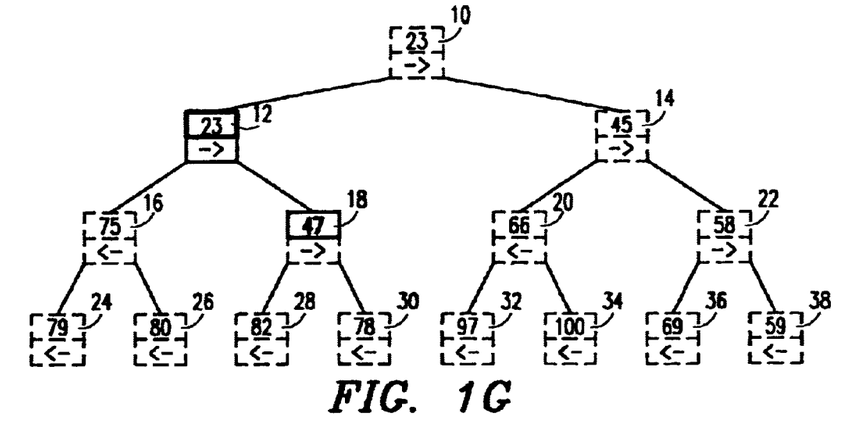
Figure 1H:
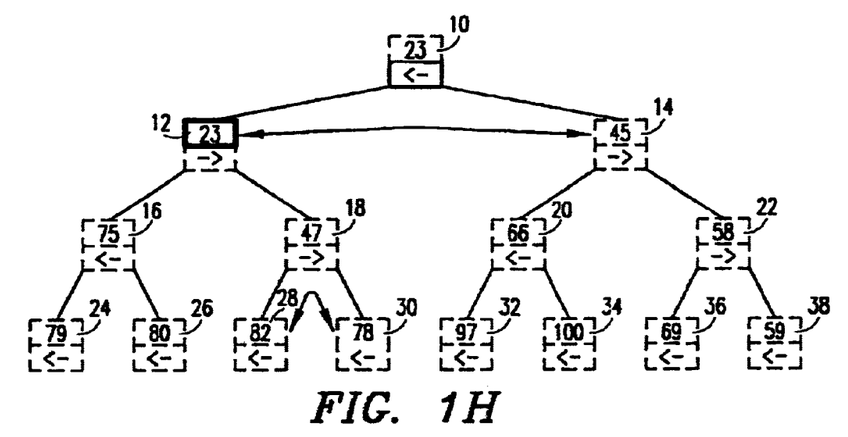
Figure 1I:
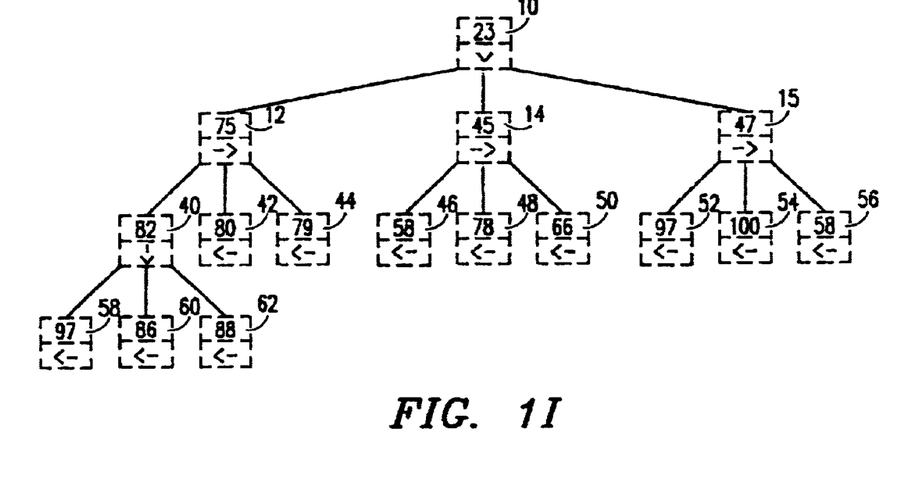

FIG. 1I is provided specifically to illustrate how a search can also be performed, in accordance with a different aspect of the preferred embodiment of the present invention, using a tree structure that includes more than two child nodes. Note that in this case, the flag shown in the block denoting node 40, points directly downward at the middle block denoting child node 60, which contains the lowest value of the trio of great-grandchildren nodes (58, 60, 62) shown.

Figure 2:
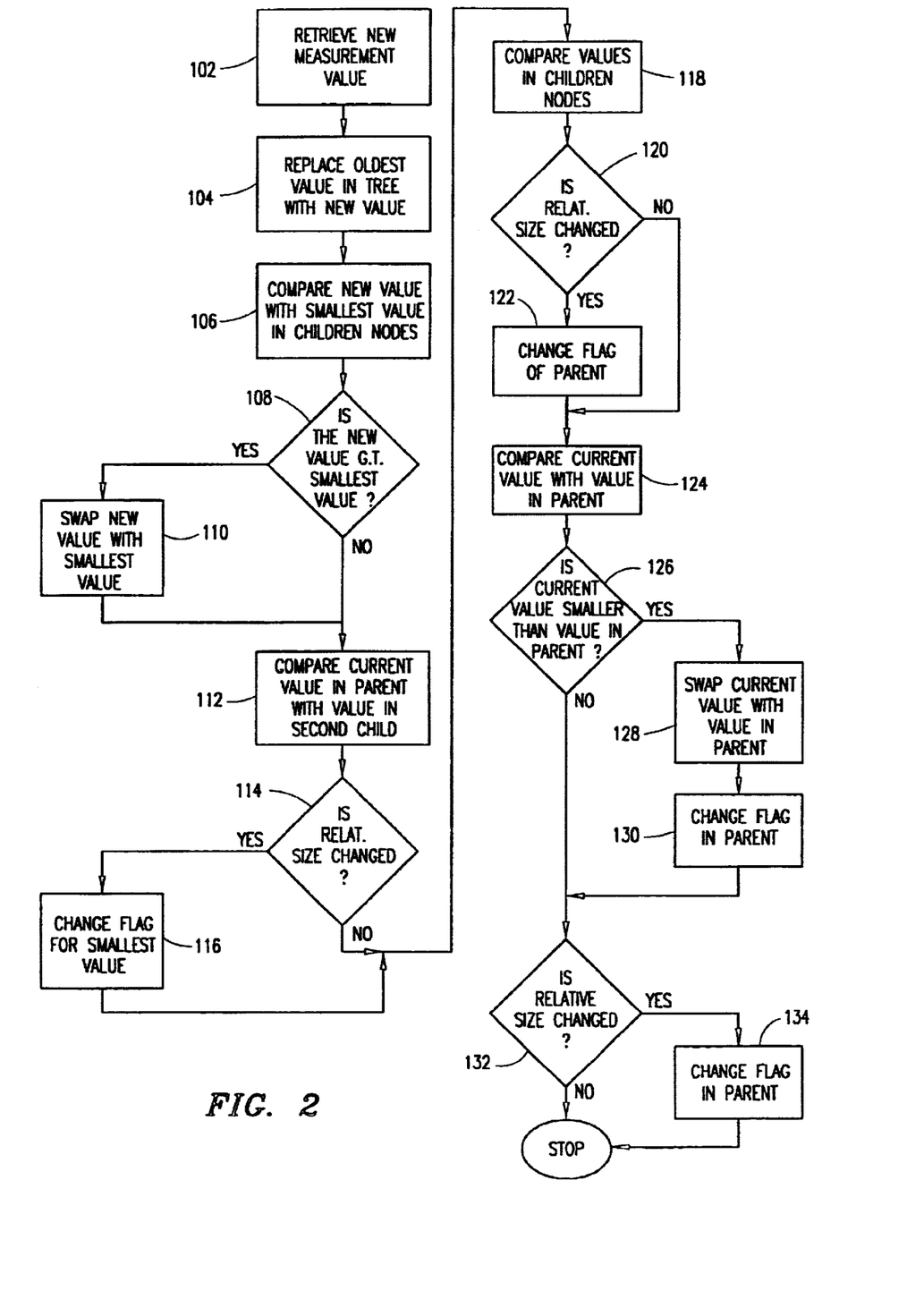
FIG. 2 is a flow diagram of an exemplary method which can be used to implement the preferred embodiment of the present invention.

FIG. 2 is a flow diagram of an exemplary method (100), which can be used to implement the preferred embodiment of the present invention. Essentially, the present method can use a binary search tree to minimize the number of search operations and computation time needed to update a signal buffer associated with a sliding window minimum (or maximum) filter. At step 102 of the exemplary method shown, and also referring to FIG. 1B for illustrative purposes, a new clock signal frequency measurement value is retrieved (e.g., from a signal buffer implemented in a Random Access Memory (RAM) circuit). The binary search (and sorting for a minimum or maximum value) can be executed by a conventional digital processor (e.g., a general purpose computer, personal computer or microprocessor), and the measurement values can be stored or contained in any appropriate storage medium. In other words, the digital processing and storage media that can be used to implement the present invention are not necessarily limited to a particular type of processor or storage medium.

At step 104, the processor replaces the oldest frequency measurement value in the tree with the newly retrieved clock signal frequency measurement value. For example, assuming that a value "58" contained in node 18 is the oldest measurement value in the tree, the newest retrieved measurement value replaces the oldest value in node 18 of the tree. However, as mentioned above, for this embodiment, the oldest value can be located in any node of the tree.

At step 106, referring now to FIG. 1C, a comparison is made between the newest measurement value (e.g., "85 ") contained in node 18, and the smallest value (e.g., "78") contained in the children nodes (e.g., in node 30). At step 108, if the newest measurement value ("85") in the parent node 18 is greater than the smallest measurement value ("78") in the child node 30 (which it is in this case), then at step 110, the processor swaps the smallest measurement value ("78") with the newest measurement value ("85"), as shown in FIG. 1D. As such, for the conditions shown, the parent node 18 now contains the value "78", and the child node 30 now contains the larger value "85".

At step 112, the measurement value "78" now contained in the parent node 18 is compared with the measurement value "75" in the child node 16. At step 114, if the relative size of the values in these children nodes has changed (which it has in this case), then at step 116, the flag of the parent node (12) would be changed. As such, as illustrated by the flags shown in FIG. 1D, at this point, the flag in node 12 has been changed. The above-described steps (106–112) can then be repeated until the newly inserted value in the parent node 18 is less than or equal to the value in the second child node (e.g., node 28), or until no other child node is available for comparison purposes. Notably, for a parent in any such binary tree, one or both children can be missing.

At step 118, the measurement value "85" in the child node 30 is compared with the measurement value "82" in the child node 28. At step 120, if the relative size of the values in these children nodes has changed (which it has in this case), then at step 122, the flag of the parent node 18 is changed to reflect the direction of the smaller value. As shown in FIG. 1E, the direction of the flag of the parent node 18 has been changed (as compared to FIG. 1D).

Referring now to FIGS. 1F and 2, for illustrative purposes, it can be assumed that a new clock signal frequency measurement value (e.g., "23") has been retrieved and inserted in node 18 in place of the oldest measurement value. At step 124, the processor makes a comparison between the newly inserted measurement value "23" in node 18 and the measurement value "47" in the parent node 12. At step 126, if the new measurement value "23" in node 18 is smaller than the value "47" of the parent node 12 (which it is in this case), then at step 128, the processor swaps the measurement value "23" in node 18 with the measurement value "47" in node 12. At step 130, the flag for the parent node 12 is changed to the direction of the flag in the previous node 18, as shown in FIG. 1G. The above-described steps are then repeated until the newly inserted clock signal frequency measurement value in a particular child node is greater than or equal to the measurement value in the respective parent node, or the current code is in the root node at the top of the tree. For example, as shown in FIG. 1G, the measurement value "23" shown in node 12 is now equal to the measurement value "23" in the parent node 10.

Referring now to FIGS. 1H and 2, at step 132, the processor compares the newly inserted measurement value "23" in the child node 12 with the measurement value "45" in the companion child node 14. If the relative size of the measurement values in those two children nodes has changed, then at step 134, the flag of the parent node 10 is changed to reflect the direction of the change.

As can be understood from the above-described, exemplary methods for implementing the present invention, both the sorted minimum (and/or maximum) clock signal frequency measurement values can be derived from the binary tree search. As shown, the minimum values start at the root of the tree and flow downwards to the maximum values. Alternatively, the search method can be reversed so that the maximum values start at the root of the tree and flow downwards to the minimum values. For each such case, the significant savings in the number of search or computation operations and time are similar.

FIGS. 3A–3H are related diagrams of a binary search tree that can be used to implement a reverse search method, in accordance with a second embodiment of the present invention. As illustrated by FIGS. 3A–3H, for this exemplary embodiment, a binary tree is used to sort (from the root downward) the maximum values (as opposed to sorting the minimum values) derived from system clock signal frequency measurements.

Figure 3A:
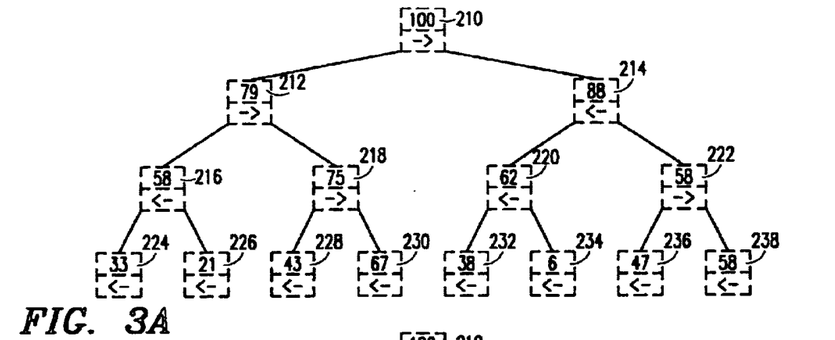
FIGS. 3A–3I are related diagrams of a search tree that can be used to implement a reverse search method, in accordance with a second embodiment of the present invention.
Figure 3B:
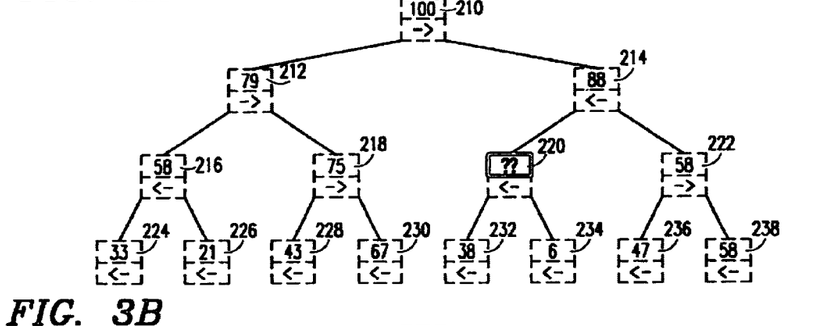

Referring to FIG. 3A, as implemented by a method of the present invention (e.g., see FIG. 4 below), the root 210 of the tree contains the largest frequency measurement value. The children (e.g., 212, 214) contain frequency measurement values which are smaller than the value contained in the parent node (e.g., node 210). A flag (indicated by an arrow) associated with each child indicates which child (grandchild or great-grandchild) of a pair contains the largest value.

Figure 3C:
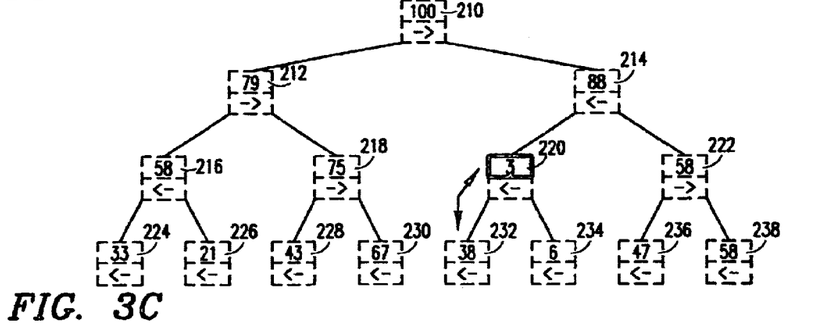
Figure 3D:
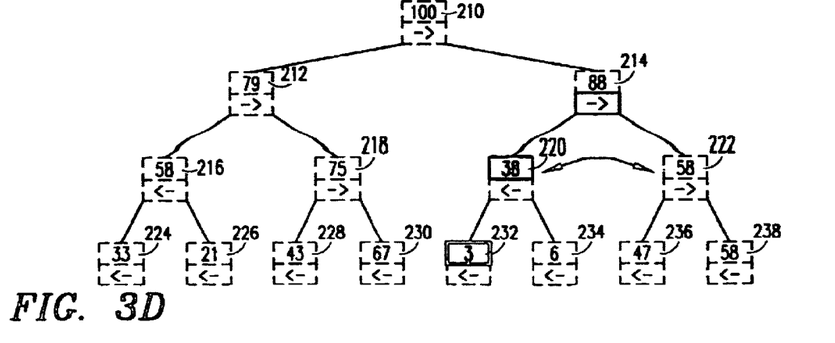
Figure 3E:
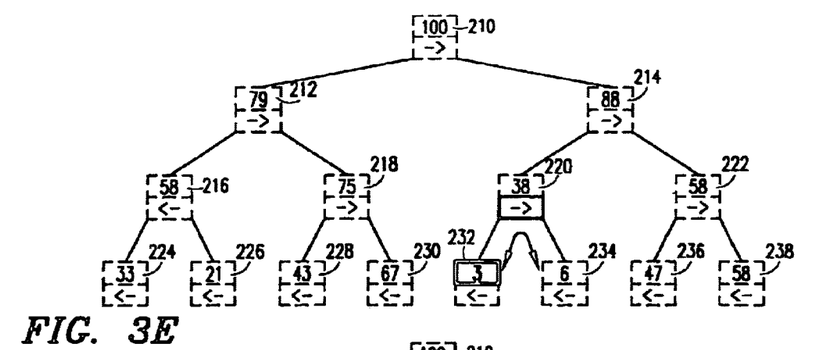
Figure 3F:
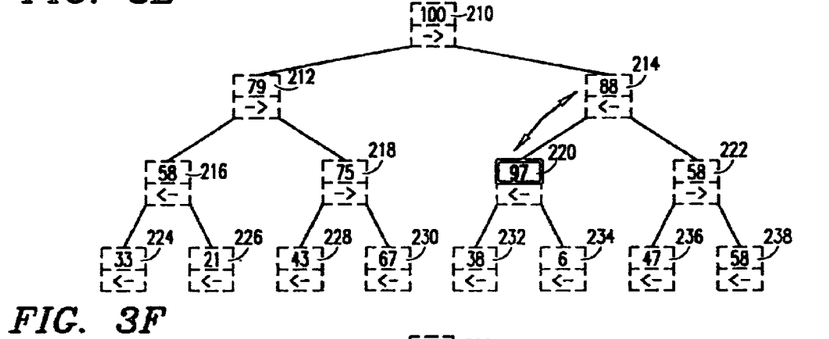
Figure 3G:
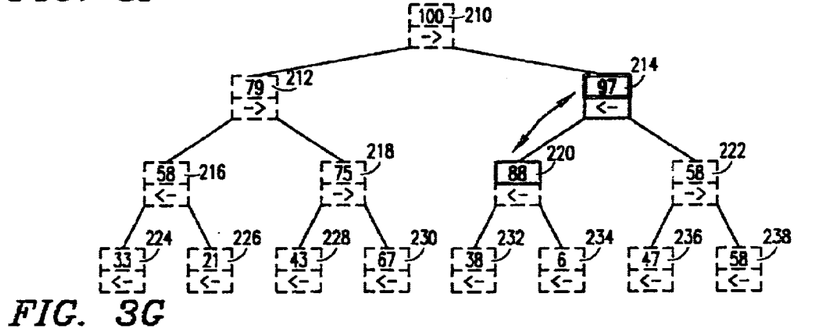
Figure 3H:
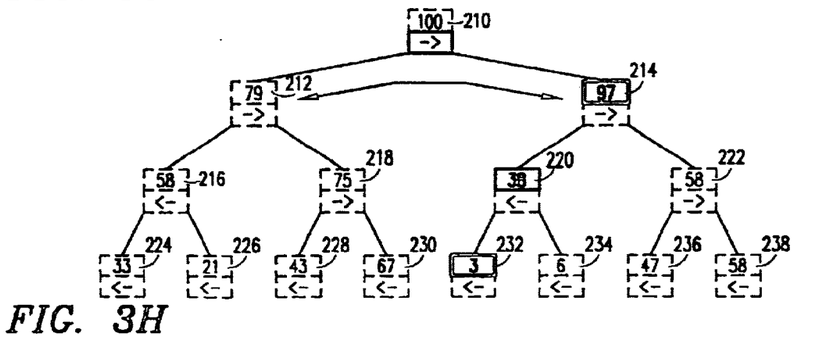
Figures 3I, 5A:
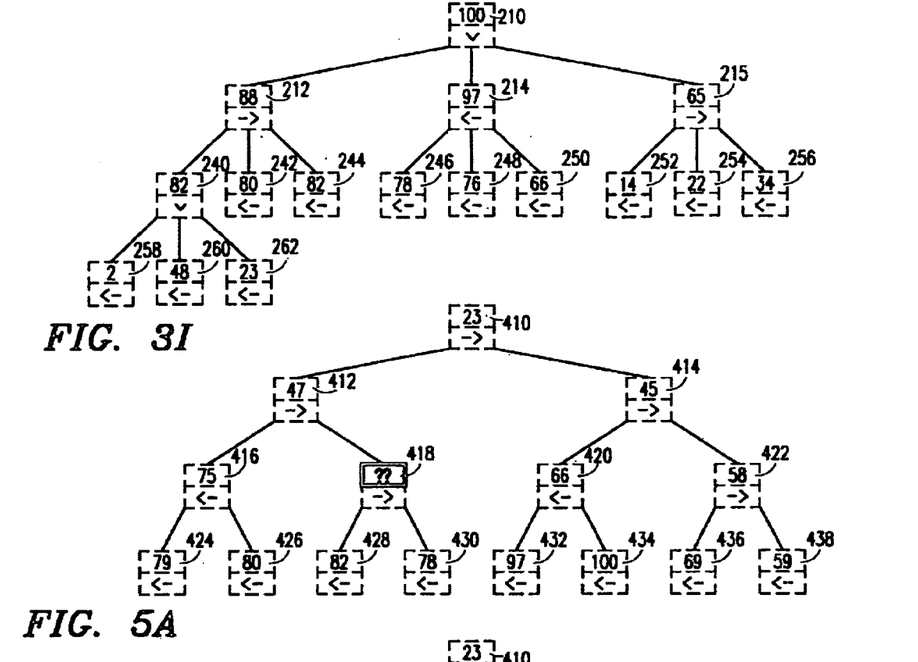
FIGS. 5A–5D are related diagrams of a binary search tree that can be used to implement a forward search method, in accordance with a third embodiment of the present invention.

FIG. 3I is provided specifically to illustrate how a search can be performed, in accordance with a different aspect of the second embodiment of the present invention, using a tree structure that includes more than two child nodes. Note that in this case, the flag shown in the block denoting node 240, points directly downward at the middle block denoting child node 260, which contains the highest value of the trio of great-grandchildren nodes (258, 260, 262) shown.

Figure 4:
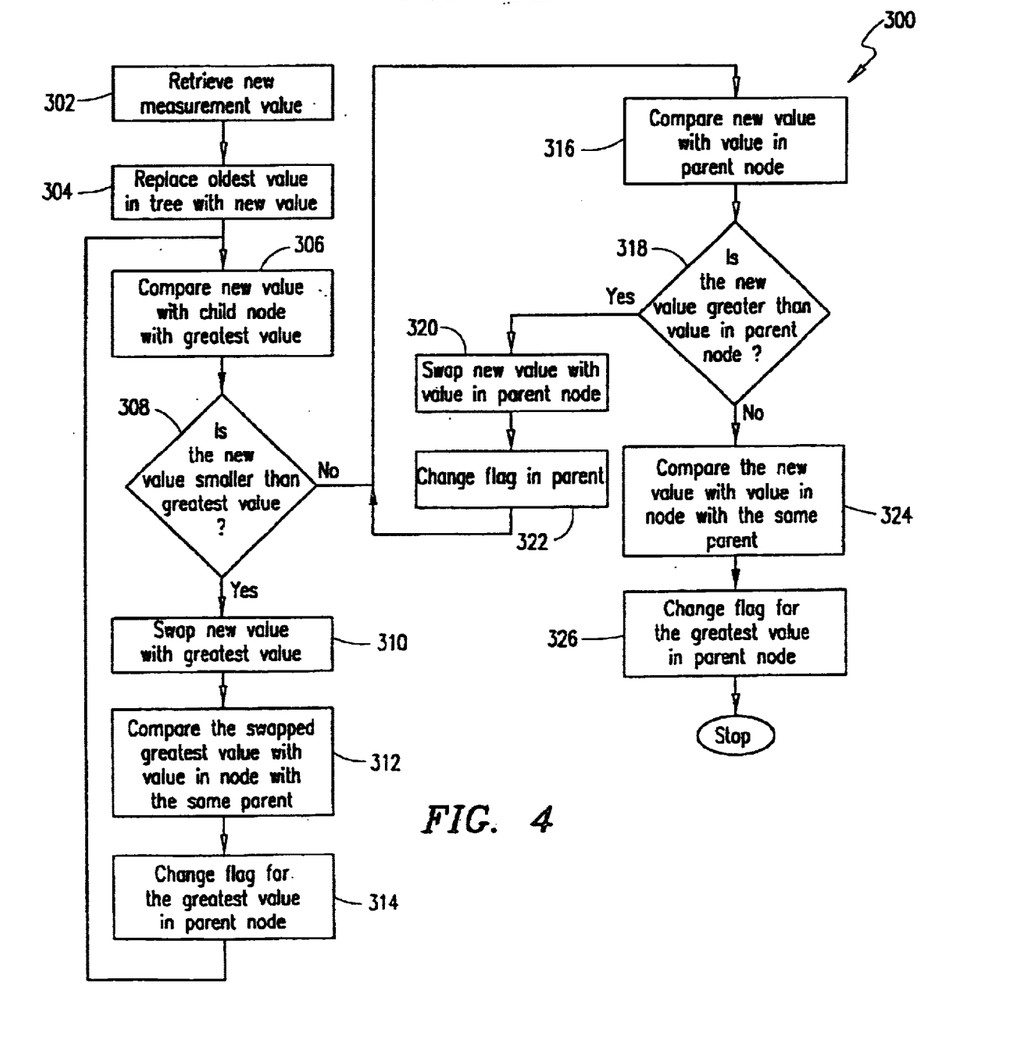
FIG. 4 is a flow diagram of an exemplary method, which can be used to implement the second embodiment of the present invention.

FIG. 4 is a flow diagram of an exemplary method (300), which can be used to implement the second embodiment of the present invention. Essentially, the present method can be use a binary search tree to minimize the number of search operations and computation time needed to update a signal buffer associated with a sliding window minimum (or maximum) filter. At step 302 of the exemplary method shown, and also referring to FIG. 3B for illustrative purposes, a new clock signal frequency measurement value is retrieved (e.g., from a signal buffer implemented in a RAM circuit). At step 304, the processor performing the search replaces the oldest frequency measurement value in the tree with the newly retrieved clock signal frequency measurement value. For example, assuming that a value "62" contained in node 220 (see FIG. 3A) is the oldest measurement value in the tree, the newest retrieved measurement value replaces the oldest value in node 220 of the tree. However, as mentioned above, the oldest value can be located in any node of the tree.

At step 306, referring now to FIG. 3C, a comparison is made between the newest measurement value (e.g., "3") contained in node 220, and the largest value (e.g., "38") contained in the children nodes (e.g., in node 232). At step 308, if the newest measurement value ("3") in the parent node 220 is smaller than the largest measurement value ("38") in the child node 232 (which it is in this case), then at step 310, the processor swaps the largest measurement value ("38") with the newest measurement value ("3"), as shown in FIG. 3D. As such, for the conditions shown, the parent node 220 now contains the value "38", and the child node 232 now contains the smaller value "3".

At step 312, the measurement value "38" now contained in the parent node 220 is compared with the measurement value "58" in the child node 222. At step 314, if the relative size of the values in these children nodes has changed (which it has in this case), then the flag of the parent node (214) would be changed. As such, as illustrated by the flags shown in FIG. 3D, at this point, the flag in node 214 has been changed. The above-described steps (306–312) can then be repeated until the newly inserted value in the parent node 220 is greater than the value in the second child node (e.g., node 234), or until no other child node is available for comparison purposes. Notably, as mentioned earlier, for a parent in any such binary tree, one or both children can be missing.

Returning to step 308 (see FIG. 3C), if the newest measurement value ("3") in the parent node 220 is not smaller than the largest measurement value ("38") in the child node 232 (which is not the case for this example), then at step 316, a comparison is made between the newest measurement value ("3") in node 220 and the measurement value ("88") in its parent node 214. If the newest measurement value ("3") in node 220 is not larger than the measurement value ("88") in the parent node 214 (which it is not in FIG. 3C), then at step 324, the processor compares the newest value in node 220 with the value in the other child node 222 of the parent node 214. At step 326, the flag of the parent node 214 is changed to reflect the direction of the larger value (e.g., "58" in child node 222). FIG. 3E shows the direction of the resulting flag in node 214.

Referring now to FIGS. 3F and 4, for illustrative purposes, it can be assumed that a new clock signal frequency measurement value (e.g., "97") has been retrieved and inserted in node 220 in place of the oldest measurement value. Returning to step 318, the processor makes a comparison between the newly inserted measurement value "97" in node 220 and the measurement value "88" in the parent node 214. If the new measurement value "97" in node 220 is larger than the measurement value "88" of the parent node 214 (which it is in this case), then at step 320, the processor swaps the new measurement value "97" in node 220 with the measurement value "88" in node 214. At step 322, the flag for the parent node 214 is changed to reflect the direction of the child node (e.g., 220) with the largest value relative to that of the other child node (e.g., 222), as shown in FIG. 3G. The above-described steps are then repeated until the newly inserted clock signal frequency measurement value in a particular child node is less than the measurement value in the respective parent node, or the current code is in the root node at the top of the tree. As shown in FIG. 3H, the flag of the parent (root) node 210 reflects the direction of the child node 214 that contains the largest value "97" in the two children nodes (212, 214).

FIGS. 5A–5D are related diagrams of a binary search tree that can be used to implement a forward search method, in accordance with a third embodiment of the present invention. As illustrated by FIGS. 5A–5D, for this exemplary embodiment, a binary tree is used to sort (from the root downward) the minimum values derived from system clock signal frequency measurements. In other words, the values are sorted to become larger as they progress down the nodes of the tree.

Referring to FIG. 5A, as implemented by a method of the present invention (e.g., see FIG. 6 below), the root 410 of the tree contains the lowest frequency measurement value. The children (e.g., 412, 414) contain frequency measurement values which are greater than or equal to the value contained in the parent node (e.g., node 410). A flag associated with each child indicates which child (grandchild or great-grandchild) of a pair contains the smallest value.

Figure 5B:
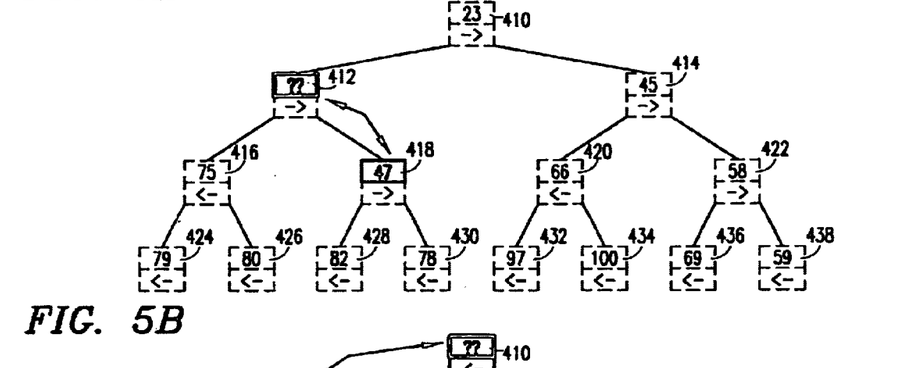
Figure 5C:
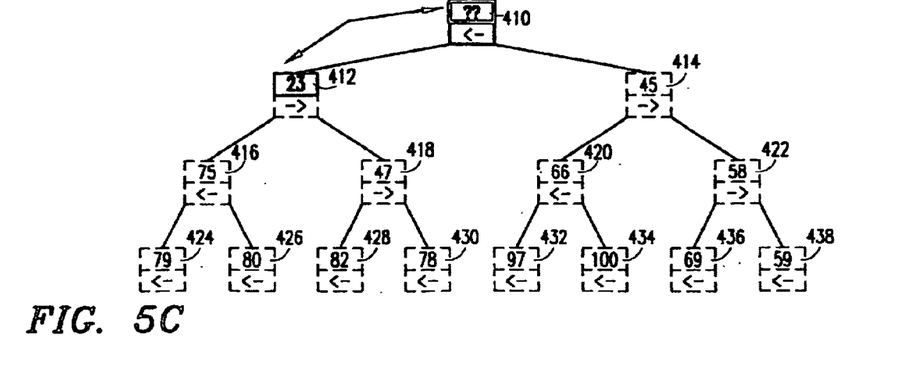
Figure 6:
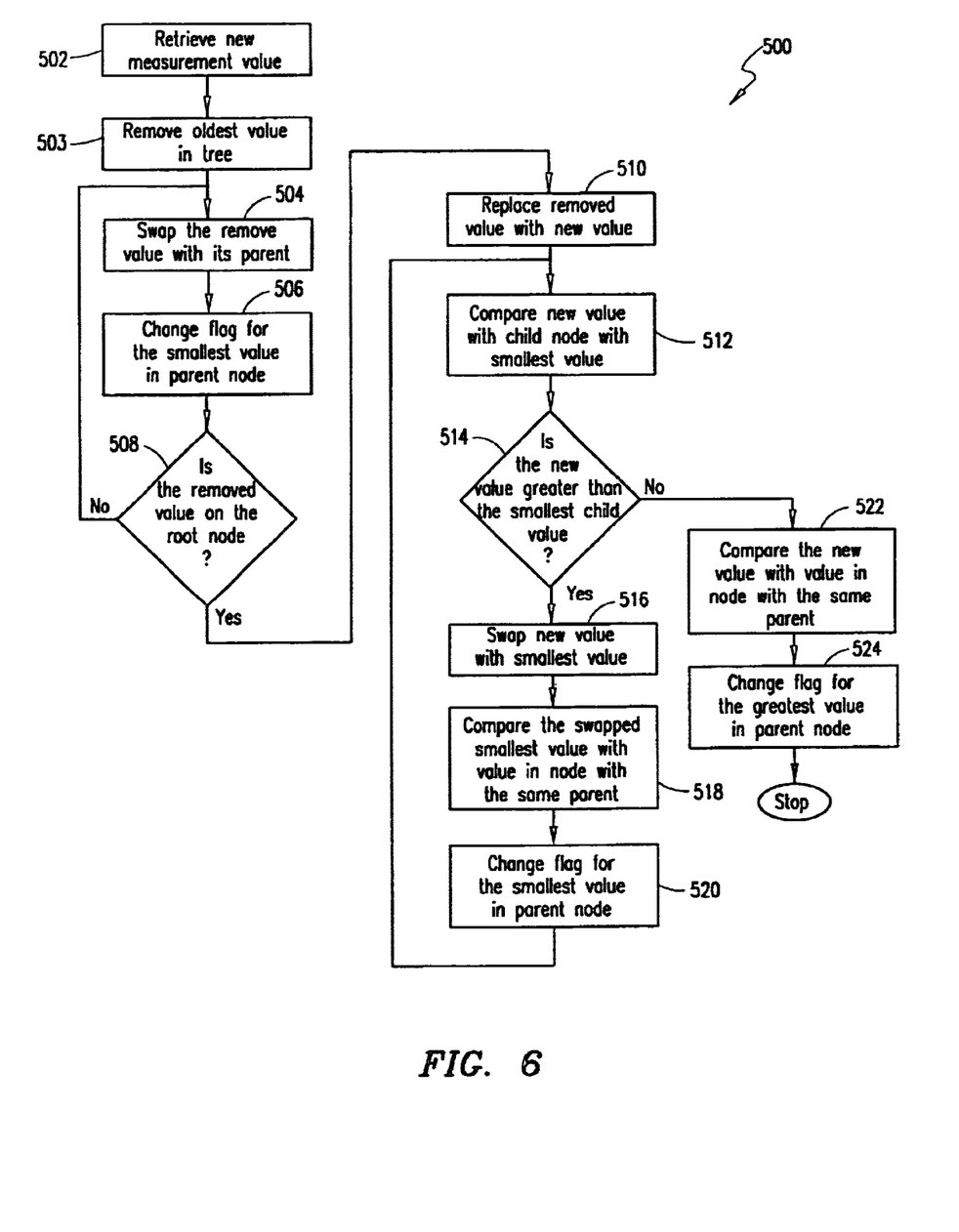
FIG. 6 is a flow diagram of an exemplary method, which can be used to implement the third embodiment of the present invention.

FIG. 6 is a flow diagram of an exemplary method (500), which can be used to implement the third embodiment of the present invention. At step 502 of the exemplary method shown, and also referring to FIG. 5A for illustrative purposes, a new clock signal frequency measurement value is retrieved (e.g., from a signal buffer implemented in a RAM circuit). At step 503, the processor removes the oldest value from its node (e.g., node 418) in the tree. At step 504, as illustrated in FIG. 5B, the processor swaps the removed value with the measurement value ("47") in the parent node (node 412 in this example). At step 506, the flag of the parent node 412 is changed to reflect the direction of its child node (e.g., node 418) that contains the smallest value.

At step 508, the processor determines whether the removed value is contained in the root node 410. If not, the method returns to step 504. If so, at step 510, referring now to FIG. 5C, the processor replaces the removed value in the root node with the newly retrieved value. At step 512, the new value is compared with the child node (412) containing the smallest value "23" of the two child nodes (412, 414).

Figure 5D:
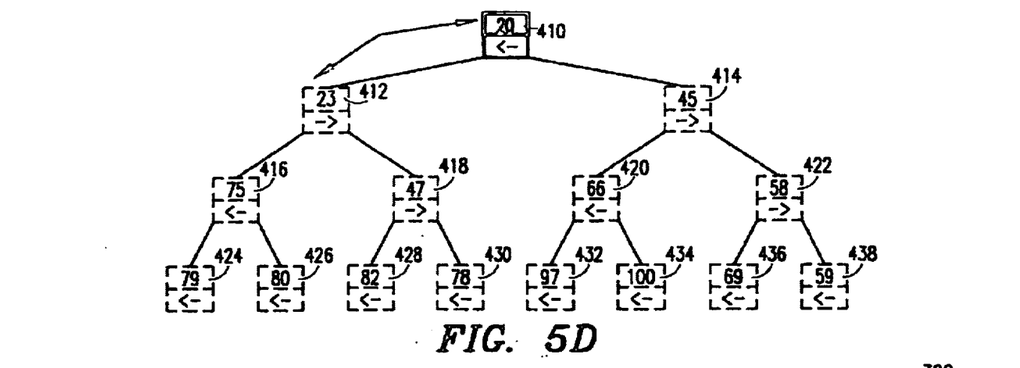

At step 514, if the new value is greater than the smallest value in the child nodes, then at step 516, the processor swaps the new value (in node 410) with the smallest value in the child nodes. At step 518, the swapped smallest value in the child node 412 is compared with the value "45" in the other child node (e.g., 414) of that same parent (e.g., parent node 410). At step 520, as illustrated in FIG. 5D, the processor changes the flag in the parent node (node 410) to reflect the direction of the child node (412) containing the smallest value ("23") of the two child nodes (412, 414).

Returning to step 514, if the new value is not greater than the smallest value in the child nodes (412, 414), then at step 522, the new value is compared with the value in the other child node. At step 524, the processor changes the flag in the parent node (node 410) to reflect the direction of the child node (414) containing the largest value ("45") of the two child nodes (412, 414).

A listing for a computer program that can be used to implement the preferred embodiment is appended below.

Although a preferred embodiment of the method and apparatus of the present invention has been illustrated in the accompanying Drawings and described in the foregoing Detailed Description, it will be understood that the invention is not limited to the embodiment disclosed, but is capable of numerous rearrangements, modifications and substitutions without departing from the spirit of the invention as set forth and defined by the following claims.

```
1    #include <stdio.h>
3    #define WINDOW_SIZE 1000
5    typedef struct Heap_struct
6    {
7        unsigned int q_index;
8        char swap_child;
9    } Heap_struct;
11   typedef struct Q_struct
12   {
13       int value;
14       unsigned int min_heap_index;
15       unsigned int max_heap_index;
16   } Q_struct;
19   void HeapInit(Heap_struct *heap_p)
20   {
21       int i;
23       for (i=0; i<WINDOW_SIZE; i++)
24       {
25           heap_p[i+1].q_index = i;
26           heap_p[i+1].swap_child = 0;
27       }  /* for */
28   }  /* HeapInit */
31   void QInit(Q_struct *q_p)
32   {
34       unsigned int i;
36       for (i=0; i<WINDOW_SIZE; i++)
37       {
38           q_p[i].min_heap_index = i+1;
39           q_p[i].max_heap_index = i+1;
40       }  /* for */
41   }  /* QInit */
44   void MinHeapMove(Q_struct *q_p,
45                    unsigned int q_index,
46                    unsigned int q_size,
47                    Heap_struct *min_heap_p)
48   {
49       unsigned int heap_index, heap_index_1, heap_index_2;
50       Q_struct q_element;
52       /* Moving the element upwards */
53       heap_index = q_p[q_index].min_heap_index;
54       heap_index_1 = heap_index >> 1;
56       while ((heap_index != 1) &&
57              (q_p[q_index].value <
58               q_p[min_heap_p[heap_index_1].q_index].value))
59       {
60           q_p[q_index].min_heap_index = heap_index_1;
```

```
 61            q_p[min_heap_p[heap_index_1].q_index].min_heap_index = heap_index;
 63            min_heap_p[heap_index].q_index = min_heap_p[heap_index_1]. q_index;
 64            min_heap_p[heap_index_1]. q_index = q_index;
 65            min_heap_p[heap_index_1].swap_child = heap_index & 1;
 67            heap_index = heap_index_1;
 68            heap_index_1 = heap_index >> 1;
 69        }  /* while */
 71        /* Moving the element downwards      */
 72        heap_index_1 = (heap_index << 1) | min_heap_p[heap_index]. swap_child;
 73        heap_index_2 = heap_index ^ 1;
 75        while ((heap_index_1 < q_size) &&
 76                (q_p[q_index].value >
 77                q_p[min_heap_p[heap_index_1].q_index].value))
 78        {
 79            q_p(q_index].min_heap_index = heap_index_1;
 80            q_p[min_heap_p[heap_index_1].q_index].min_heap_index = heap_index;
 82            min_heap_.p[heap_index).q_index = min_heap_p[heap_index_1].q_index;
 83            min_heap_p(heap_index_1].q_index = q_index;
 85            if ((heap_index != 1) && (heap_index_2 >= q_size))
 86            {
 87                min_heap_p[heap_index >> 1].swap_child =
 88                    ((q_p[min_heap_p[heap_index].g_index].value >
 89                    q_p[min_heap_p[heap_index_2].q_index].value) ?
 90                    heap_index_2 & 1 :
 91                    heap_index & 1);
 92            }  /* if */
 94            heap_index = heap_index_1:
 95            heap_index_1 = (heap_index << 1) | min_heap_p[heap_index].swap_child;
 96            heap_index_2 = heap_index ^ 1;
 97        }  /* while */
 99        /* Adjust the swap_child within same level    */
100        if ((heap_index != 1) && (heap_index_2 <= q_size))
101        {
102            min_heap_p[heap_index >> 1].swap_child =
103                ((q_p[q_index].value > q_p[min_heap_p[heap_index_2].q_index].value) ?
104                heap_index_2 & 1 :
105                heap_index & 1);
106        }  /* if */
108    }  /* MinHeapMove */
111    void MaxHeapMove(Q_struct *q_p,
112                     unsigned int q_index,
113                     unsigned int q_size,
114                     Heap_struct *max_heap_p)
115    {
116        unsigned int heap_index, heap_index_1, heap_index_2;
117        Q_struct q_element;
119        /* Moving the element upwards */
120        heap_index = q_p[q_index].max_heap_index;
121        heap_index_1 = heap_index >> 1;
123        while ((heap_index != 1) &&
124                (q_p[q_index].value >
125                q_p[max_heap_p[heap_index_1].q_index].value))
126        {
127            q_p[q_index].max_heap_index = heap_index_1;
128            q_p[max_heap_p[heap_index_1].q_index].max_heap_index = heap_index;
130            max_heap_p[heap_index].q_index = max_heap_p[heap_index_1].q_index;
131            max_heap_p[heap_index_1]q_index = q_index;
132            max_heap_p[heap_index_1].swap_child = heap_index & 1;
134            heap_index = heap_index_1;
135            heap_index_1 = heap_index >> 1;
136        }  /* while */
138        / Moving the element downwards      */
139        heap_index_1 = (heap_index << 1) | max_heap_p[heap_index]. swap_child;
140        heap_index_2 = heap_index ^ 1;
142        while ((heap_index_1 < q_size) &&
143                (q_p[q_index].value <
144                q_p[max_heap_p]heap_index_1].q_index].value))
145        {
146            q_p[q_index].max_heap_index = heap_index_1;
147            q_p[max_heap_p[heap_index_1].max_heap_index = heap_index;
149            max_heap_p[heap_index]. q_index = max_heap_p[heap_index_1]q_index;
150            max_heap_p[heap_index_1]. q_index = q_index;
152        if ((heap_index != 1) && (heap_index_2 >= q_size))
153        {
154            max_heap_p[heap_index >> 1].swap_child =
155                ((q_p[max_heap_p[heap_index].q_index].value <
156                q_p[max_heap_p[heap_index_2].q_index].value) ?
157                heap_index_2 & 1
158                heap_index & 1);
```

```
159            }  /* if */
161            heap_index = heap_index_1
162            heap_index_1 = (heap_index << 1) | max_heap_p[heap_index].swap_child;
163            heap_index_2 = heap_index ^ 1;
164        }  /* while */
166        /* Adjust the swap_child within same level    */
167        if ((heap_index != 1) && (heap_index_2 <= q_size))
168        {
169            max_heap_p[heap_index >> 1].swap_child =
170                ((q_p[q_index].value < q_p[max_heap_p[heap_index_2].q_index].value) ?
171                    heap_index_2 & 1 :
172                    heap_index & 1);
173        }  /* if */
175    }  /* MaxHeapMove */
178    void main(void)
179    {
180        Heap_struct min_heap[WINDOW_SIZE+1];
181        Heap_struct max_heap[WINDOW_SIZE+1];
182        Q_struct queue[WINDOW_SIZE];
183        unsigned int q_index = 0;
184        unsigned int q_size = 0;
185        int min_val, max_val;
186        int i;
188        HeapInit (min_heap);
189        HeapInit (max_heap);
190        QInit(queue);
192        while (scanf("%d\n", &(queue[q_index].value)) != EOF)
193        {
194            q_size = ((q_size == WINDOW_SIZE) ?
195                        WINDOW_SIZE :
196                        q_size + 1);
198            MinHeapMove(queue, q_index, q_size, min_heap);
199            MaxHeapMove(queue, q_index, q_size, max_heap);
201            /* Calculate max/min in usual way      */
202            min_val = queue[0].value;
203            max_val = queue[0].value;
204            for (i=1; i<q_size; i++)
205            {
206                if (min_val > queue[i].value) min_val = queue[i].value;
207                if (max_val < queue[i].value) max_val = queue[i].value;
208            }  /* for */
210 /*         for (i=1; i<q_size; i++)
211 /*         {
212 /*             printf("%d\t", queue[min_heap[i].q_index].value);
213 /*         }  /* for */
214 /*         printf("\n");
215 /*
216 /*         for (i=1; i<=q_size; i++)
217 /*         {
218 /*             printf("%d\t", min_heap[i].swap_child);
219 /*         }  /* for */
220 /*         printf("\n");
221 /*
222 /*         for (i=1; i<=q_size; i++)
223 /*         {
224 /*             printf("%d\t", queue[max_heap[i].q_index].value);
225 /*         }  /* for */
226 /*         printf("\n");
227 /*
228 /*         for (i=1; i<q_size; i++)
229 /*         {
230 /*             printf("%d\t", max_heap[i].swap_child);
231 /*         }  /* for */
232 /*         printf("\n");
233 */
234        printf("Queue index =\t%d\tQueue size =\t%d\tNew value =\t%d\tMin value =\t%d\t%d\t Max value =\t%d\t%d\n",
235            q_index,
236            q_size,
237            queue[q_index].value,
238            queue[min_heap[1].q_index].value,
239            min_val,
240            queue[max_heap[1].q_index].value.
241            max_val)
243            q_index++;
244            q_index %= WINDOW_SIZE;
246        }  */ while */
248    }  /* main */
```

What is claimed is:

1. A method for determining a minimum value for a sliding window minimum filter, comprising the steps of:

retrieving a measurement value from a digital signal buffer, a plurality of storage locations in said digital signal buffer associated with a plurality of measurement values in said sliding window of said filter;

replacing an oldest measurement value in a node of a binary tree with said retrieved measurement value;

comparing said retrieved measurement value in said node of said binary tree with a measurement value in at least one child node of said node of said binary tree;

if said retrieved measurement value in said node is greater than said measurement value in said at least one child node, swapping said retrieved measurement value in said node with said measurement value in said at least one child node;

comparing a measurement value in said node with a measurement value in a parent node of said node; and if said measurement value in said parent node is greater than said measurement value in said node, swapping said measurement value in said parent node with said measurement value in said node.

2. The method of claim 1, wherein said retrieved measurement value comprises a clock signal frequency measurement value.

3. The method of claim 1, wherein said plurality of measurement values comprises a plurality of clock signal frequency measurement values.

4. A method for reducing sliding window filter computation time, comprising the steps of:

retrieving a first value from a first digital storage location included in a plurality of digital storage locations, said plurality of digital storage locations associated with a plurality of elements within said sliding window filter;

replacing a second value in a node of a binary tree with said retrieved first value, said second value associated with a second digital storage location included in said plurality of digital storage locations;

comparing said first value in said node with a third value, said third value in a first child of said node, and said third value associated with a third digital storage location included in said plurality of digital storage locations;

if said third value is greater than said first value, swapping said first value in said node with said third value in said first child of said node;

otherwise, if said third value is not greater than said first value, comparing said first value in said node with a fourth value, said fourth value in a second child of said node, and said fourth value associated with a fourth digital storage location included in said plurality of digital storage locations;

if said fourth value is greater than a current value in said node, swapping said current value in said node with said fourth value in said second child of said node;

otherwise, if said fourth value is not greater than said current value in said node, comparing said current value in said node with a fifth value in a parent of said node; and if said current value in said node is less than said fifth value in said parent of said node, swapping said current value in said node with said fifth value in said parent of said node.

5. The method of claim 4, wherein said second value comprises the oldest value in said binary tree.

6. The method of claim 4, wherein said plurality of digital storage locations comprises a digital signal buffer.

7. The method of claim 4, wherein said retrieved first value comprises a clock signal frequency measurement value.

8. A system for computing a minimum value for a sliding window minimum filter, comprising:

a digital signal buffer, a plurality of storage locations in said digital signal buffer associated with a plurality of measurement values in said sliding window of said filter; and a processor coupled to said digital signal buffer, said processor operable to:

retrieve a measurement value from said digital signal buffer;

replace an oldest measurement value in a node of a binary tree with said retrieved measurement value;

compare said retrieved measurement value in said node of said binary tree with a measurement value in at least one child node of said node of said binary tree;

swap said retrieved measurement value in said node with said measurement value in said at least one child node if said retrieved measurement value in said node is greater than said measurement value in said at least one child node;

compare a measurement value in said node with a measurement value in a parent node of said node; and swap said measurement value in said parent node with said measurement value in said node if said measurement value in said parent node is greater than said measurement value in said node.

9. The system of claim 8, wherein said retrieved measurement value comprises a clock signal frequency measurement value.

10. The system of claim 8, wherein said plurality of measurement values comprises a plurality of clock signal frequency measurement values.

* * * * *